United States Patent [19]

Shoji

[11] Patent Number: 5,513,223

[45] Date of Patent: Apr. 30, 1996

[54] FIR DIGITAL FILTER AND METHOD FOR SIGNAL PROCESSING THEREOF

[75] Inventor: Takashi Shoji, Tokyo, Japan

[73] Assignee: NEC Corporation, Tokyo, Japan

[21] Appl. No.: 338,851

[22] Filed: Nov. 10, 1994

[30] Foreign Application Priority Data

Nov. 16, 1993 [JP] Japan ................................ 5-286308

[51] Int. Cl.[6] .......................... H03H 17/02; H03H 17/06
[52] U.S. Cl. .............................................. 375/350
[58] Field of Search ............................... 375/231–232, 375/343, 346, 356; 364/724.01, 724.11, 724.19

[56] References Cited

U.S. PATENT DOCUMENTS

| | | | |
|---|---|---|---|
| 5,287,299 | 2/1994 | Lin | 364/759 |
| 5,301,134 | 4/1994 | Maruyama | 364/724.1 |

FOREIGN PATENT DOCUMENTS

| | | |
|---|---|---|
| 63-260314 | 10/1988 | Japan . |
| 1-117437 | 5/1989 | Japan . |
| 3-6691 | 1/1991 | Japan . |
| 3-78310 | 4/1991 | Japan . |
| 3-211910 | 9/1991 | Japan . |
| 3-228421 | 9/1991 | Japan . |
| 3-261214 | 11/1991 | Japan . |
| 4-38005 | 2/1992 | Japan . |
| 4-332224 | 11/1992 | Japan . |
| 4-347921 | 12/1992 | Japan . |

*Primary Examiner*—Young Tse
*Attorney, Agent, or Firm*—Foley & Lardner

[57] ABSTRACT

An FIR digital filter of which impulse response S(t) meets an equation, $S(t)=H(t)\exp(j\omega t)$, where H(t) represents roll off characteristics and $\omega$ is an arbitrary frequency. The filter includes a data storing device for delay storing real and imaginary number data of a plurality of binary complex input data, a coefficient storing device for storing real and imaginary number coefficients corresponding to s(0), s(1), . . . , s((N−1)/2) when N is an odd number, or s(0), s(1), . . . , s(N/2−1) when N is an even number. Where s(0) to s(n−1) represent an impulse response string. The filter also includes a reversible counting and reading out device for reading the real and imaginary number coefficients stored in the coefficient storing device in order of s(0), s(1), . . . , s((N−1)/2) ) at a first order and s((N−3)/2) ) , . . . , s(1), s(0) next at a second order when N is an odd number, or in order of s(0), s (1), . . . , s(N/2−1) ) at a first order and s(N/2−1) ) , . . . , s (1), s(0) next at a second order when N is an even number. The filter also includes a sign control device for inputting the imaginary number coefficients read out and reversing sign of the imaginary number coefficients that were read out at the second order. The filter also includes a sum of products operation device for calculating sums of products for the binary complex input data input from the data storing device, the coefficient storing device and the sign control device.

12 Claims, 5 Drawing Sheets

5,513,223

FIR DIGITAL FILTER AND METHOD FOR SIGNAL PROCESSING THEREOF

BACKGROUND OF THE INVENTION

The present invention relates to an FIR digital filter, especially to an FIR digital filter used for filtering in pass band and for digital communications processing using multicarrier (a plurality of subcarriers).

In the filter coefficient h(n) of a conventional linear phase FIR digital filter such as a roll off filter having characteristics as shown in Fig.3, the following equations, h(0)=h(N-1), h(1)=h(N-2) , . . . , h((N-1)/2) =h ((N+1)/2), are satisfied when N is an odd number, where N is degree of the filter coefficient, the string of h(0), h (1), h(2), . . . , h (N-2), h (N-1) is an N impulse response string (discrete time signal string of impulse response). Also, when N is an even number, h(0)=h(N-1), h(1)=h(N-2), . . . , h(N/2-1)=h(N/2+1).

Like this, it is known that these kinds of filters generally meet the equation, h(n)=h(N-1-n), where n is a natural number meeting 0<n<N, and have a symmetric characteristics in the impulse response string.

In addition, in FIG. 3, T is a data transmission interval, α is roll off rate and ω is an arbitrary frequency.

As a prior art using this symmetry characteristics of impulse response string, an digital filter shown in FIG. 4 disclosed in Japanese Patent publication No. 6691(1991).

In FIG. 4, 700 is a shift register, 701 is a coefficient storing means, 702 is a reversible counter, 703 is a control circuit, 704 is a multiplier, 705 is an adder and 706 is an accumulator.

Features of this FIR digital filter are as below.

The system function of the FIR digital filter is represented by using a complex variable z of z-transformation as below.

$$H(z) = \sum_{n=0}^{N-1} (n)z^{-n}$$

If this filter is a linear phase FIR digital filter of which impulse response satisfies h(n)=h(N-1-n), coefficient data corresponding to h(0) to h((N-1)/2) are stored in the coefficient storing circuit 701 when the filter degree N is an odd number, or coefficient data corresponding to h(0) to h(N/2-1) are stored in the coefficient storing circuit 701 when the filter degree N is an even number.

Next, when the filter degree N is an odd number, the reversible counter 702 sequentially reads the coefficient data from h(0) to h((N-1 )/2) in order of n of h(n), then reads h((N-3)/2)) to h(0) in order contrary to the previous order.

Similarly to this, when the filter degree N is an even number, the reversible counter 702 sequentially reads the coefficient data from h(0) to h(N/2-1) in order of n of h(n), then reads h(N/2-1) to h(0) in order contrary to the previous order.

Next, the coefficient data read as above and input data stored in the shift register 700 are multiplied in the multiplier 704 and supplied to the adder 705, and a result of sum of products operation is output from the accumulator 706.

As described above, an FIR digital filter of which storage capacity is a half for N impulse response string h(0) to h(N-1) is offered.

Moreover, as an FIR digital filter using symmetry characteristics of impulse response string, there is an FIR digital filter disclosed in Japanese Patent Laid-Open No. 38005(1992).

This filter is an FIR filter having 2N taps symmetric coefficients. In this FIR digital filter, 1, 2, 3, . . . , N delayed input data are stored in the first RAM and N+1, N+2, N+3, . . . , 2N delayed input data are stored in the second RAM, respectively. Then, a multiplier receives data in order of 1, 2, 3, . . . , N from the first RAM and in the order of 2N, 2N-1, . . . , N+1 from the second RAM, and conducts sum of products operation between them and an impulse response string, h(0) to h(N).

Like this, operation time becomes a half of that in prior art.

As related arts in this field, there are arts disclosed in Japanese Patent Laid-Open No.347921(1992), Japanese Patent Laid-Open No.332224(1992), Japanese Patent Laid-Open No.261214(1991), Japanese Patent Laid-Open No.228421(1991), Japanese Patent Laid-Open No.211910(1991), Japanese Patent Laid-Open No.78310(1991), Japanese Patent Laid-Open No.117437(1989), Japanese Patent Laid-Open No.260314(1988).

The prior FIR digital filters described above are for filtering in based band, they are limited for a case that the applied impulse response string, h(n) to h(N-1) is represented by h(n)=h(N-1-n), where n is a natural number of the range, 0<n<N.

For example, as shown in FIG. 5, in a case of roll off filtering in a pass band where the impulse response S(t) is represented by the equation, S(t)=H(t)exp(jωt), where H(t) is roll off characteristics and ω is an arbitrary frequency, symmetric characteristics of impulse response string is lost. Because, the filter coefficients are represented by complex numbers and the impulse response string s(n)=a(n)+jb(n), where a(n) represents a series of real number coefficients, b(n) represents a series of imaginary number coefficients, becomes s(n)≠S(N-1-n) when a(n)=a(N-1-n) and b(n)=-b(N-1-n), where N is a number of degree of the filter.

Therefore, there has been a problem that, by only turning back reading out of the impulse response string from the center like in the prior FIR digital filter described above, it is impossible to delete any impulse response string stored in the coefficient storing circuits.

Moreover, as shown in FIG. 6, in case that input data is a signal consisted of two carriers located in symmetry to 0Hz frequency axis, for roll off filtering both the carrier 1 signal and the carrier 2 signal on its carrier frequency axis, impulse response S(t)s are respectively represented by the following equations, $$S1(t)=H(t)\exp(j\omega 1t)$$

$$S2(t)=H(t)\exp(j\omega 2t)$$

where, H(t) is roll off characteristics, ω1 is frequency of the carrier 1 and ω2 is frequency of carrier 2.

Therefore, in configuration of a prior FIR digital filter, to store only an impulse response string having a specific filter characteristics, the impulse response S1(t), for example, in the coefficient storing circuits 701 shown in FIG. 4, processing of the carrier 1 signal and carrier 2 signal must be conducted separately, so that impulse response strings stored in the coefficient storing circuits becomes two kinds for the carrier 1 and the carrier 2. As the result, operation time becomes twice compared with that for processing a carrier consisted of single wave, reduction of circuit size, power consumption and so on has been desired.

SUMMARY OF THE INVENTION

It is the first object of the present invention to provide an FIR digital filter solving the above-mentioned problems.

The second object of the present invention is to provide an FIR digital filter, of which filter coefficients are represented by complex numbers, reducing increment of coefficient storage capacity and operation processing time.

The third object of the present invention is to provide an FIR digital filter reducing increment of coefficient storage capacity and operation time against signals consisted of n waves (where, n is an even number) located in symmetry to 0Hz frequency axis.

The objects of the present invention are achieved by an FIR digital filter of which impulse response S(t) meets an equation, $S(t)=H(t)\exp(j\omega t)$, where H(t) is roll off characteristics, $\omega$ is arbitrary frequency, the digital filter comprising: a data storing means for delay-storing real number data and imaginary number data of a plurality of binary complex input data; a coefficient storing means for storing binary complex filter's real number coefficients and imaginary number coefficients corresponding to s(0), s(1), ..., s((N−1)/2) when N is an odd number, or storing binary complex filter's real number coefficients and imaginary number coefficients corresponding to s(0), s(1), ..., s(N/2−1) when N is an even number, where s(0) to s(N−1) represents an impulse response string; a reversible counting and reading out means for reading the real number coefficients and imaginary number coefficients stored in the coefficient storing means in order of s(0), s(1), ..., s((N−1)/2) at first and s((N−3)/2)), ..., s(1), s(0) next when N is an odd number, or reading the real number coefficients and imaginary number coefficients stored in the coefficient storing means in order of s(0), s(1), ..., s(N/2−1) at first and s (N/2−1), ..., s(1), s(0) next when N is an even number; a sign control means for inputting the imaginary number coefficients read out and reversing sign of the imaginary number coefficients input when the input imaginary number coefficients are those that were read out secondary; and a sum of products operation means for operating sum of products for the binary complex input data input from the data storing means and the binary complex filter's coefficients output from the coefficient storing means and the sign control means.

By the above configuration, when reading out imaginary number coefficients again in contrary order to the first reading out operation, the capacity for storing coefficients that is N impulse response string's s(0) to s(N−1) of a roll off filter (FIR digital filter) in pass band can be reduced into a half by providing a sign control means for reversing its sign.

Moreover, the above objects of the present invention are achieved by an FIR digital filter further comprising, in addition to the above configuration, a second sign reversing means for reversing sign of output of the fourth multiplier, a third accumulating means for accumulating output of the second sign reversing means and output of the first multiplier, a third sign reversing means for reversing sign of output of the third multiplier and a fourth accumulating means for accumulating output of the third sign reversing means and output of the second multiplier.

By configuring as above, it becomes possible to obtain filtering signal components by storing only a half of an impulse response string consisted of n (n is an even number) wave carriers located in symmetry to 0Hz frequency axis, summing of products on only a half part of carrier signals, that is, omitting sum of products operation for carrier signals of opposite side.

By the reason, prior coefficient storage capacity and operation time that increases n times can be reduced into a half thereof.

This and other objects, features and advantages of the present invention will become more apparent upon a reading of the following detailed description and drawings.

DESCRIPTION OF THE PREFERRED EMBODIMENT

Firstly, the first embodiment is explained.

Figure 1:
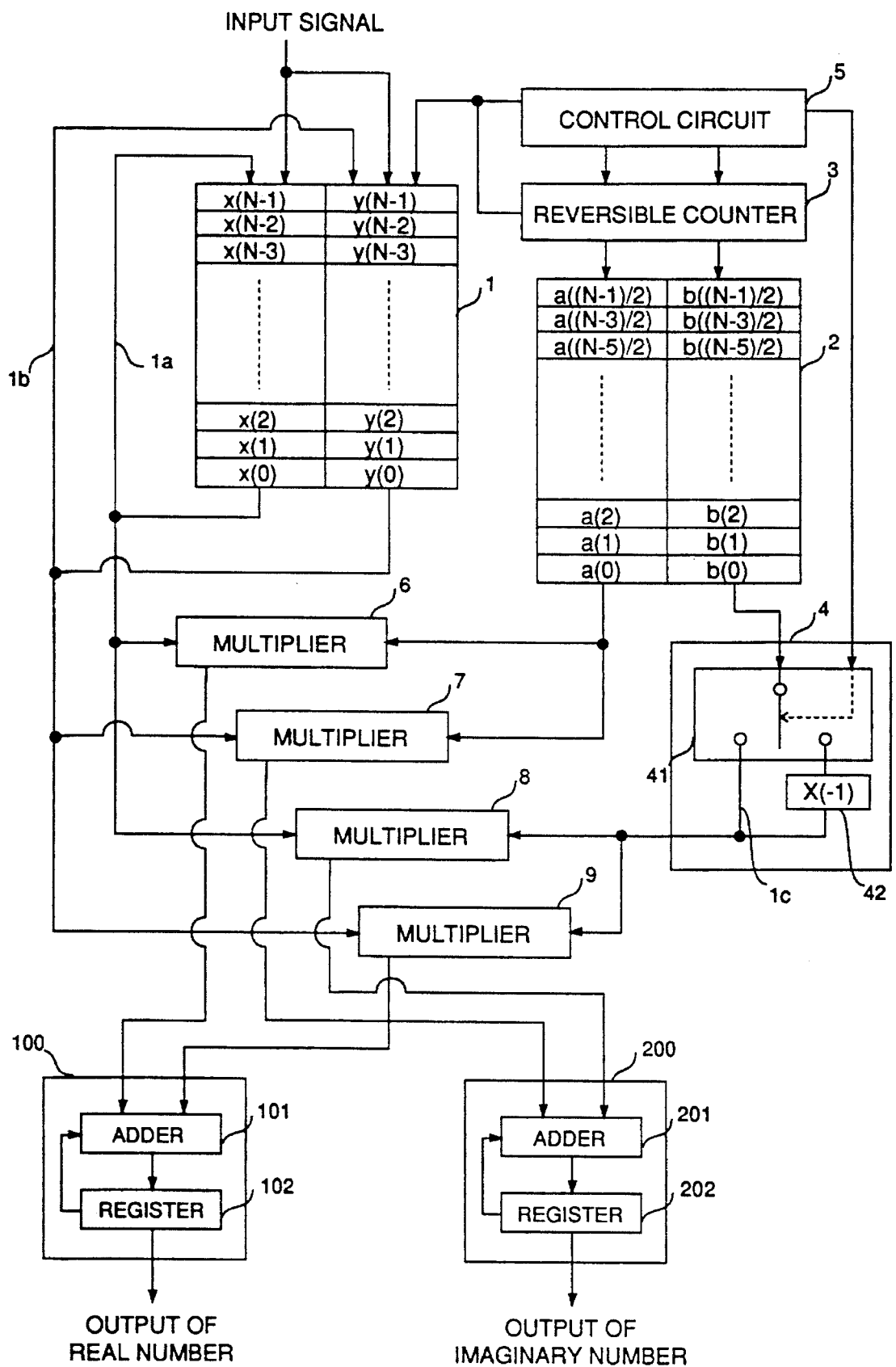
FIG. 1 is a figure showing a circuit configuration of the first embodiment of the present invention.

FIG. 1 is a figure showing a circuit configuration of the first embodiment of the present invention.

1 is a shift register. This shift register 1 inputs a binary complex data consisted of a pair of a real number data and an imaginary number data. From x(0) for the real number data and from y(0) for the imaginary number data, the data is sequentially stored as being delayed. Data input in x(n) and y(n) cause the shift resister 1 to delete the data stored in x(0) and y(0), thus the shift register 1 always stores N data.

2 is a coefficient storing circuit. When the degree of filter is N and N is an odd number, for 0 to ((N−1)/2) taps' real number coefficients and imaginary number coefficients of a binary complex filter coefficients of a filter in a desired pass band, the coefficient storing circuit 2 stores real number coefficients in a(0) to a((N−1)/2) and imaginary number coefficients in b(0) to b((N−1)/2). The coefficient storing circuit 2 in FIG. 1 shows the case that N is an odd number.

Moreover, when the N is an even number, for 0 to (N/2−1) taps' real number coefficients and imaginary number coefficients of a binary complex filter coefficients of a filter in a desired pass band, the coefficient storing circuit 2 stores real number coefficients in a(0) to a((N/2−1) and imaginary number coefficients in b(0) to b((N/2−1).

3 is an reversible counter. This reversible counter 3 sequentially reads out binary complex filter coefficients stored in the coefficients storing circuit 2 from a(0) and b(0) at input timing of one data output from the shift register 1 to a multiplier according to a timing instruction of a control circuit 5 described later. When N is an odd number, after reading out a(0) to a((N−1)/2) and b(0) to b((N−1)/2), the reversible counter 3 reads out down from a((N−3)/2)) to a(0) for real number coefficients and b((N−3)/2)) to b(0) for imaginary number coefficients. Also, when N is an even number, after reading out a(0) to a(N/2−1) and b(0) to b(N/2−1), the reversible counter 3 reads out down from a(N/2−1) to a(0) for real number coefficients and b(N/2−1) to b(0) for imaginary number coefficients.

Next, the read out real number coefficients are output to a multiplier 6 and a multiplier 7. The read out imaginary number coefficients are output to a sign control circuit 4 described later.

4 is the sign control circuit. It controls sign of input imaginary number coefficients. This sign control circuit 4 comprises a switching circuit 41 and sign reversing circuit 42.

The switch of the switching circuit 41 is usually set on the side of the multiplier 8 and the multiplier 9 (the side of 1c), and it is turned to the side of the sign reversing circuit 42 to input the input imaginary number coefficient to the sign reversing circuit 42 in accordance with the timing of input a control signal from the control circuit 5.

The sign reversing circuit 42 reverses sign of the input imaginary number coefficients and outputs them to the multiplier 8 and the multiplier 9.

5 is a control circuit for controlling the shift register 1, the reversible counter 3 and the sign control circuit 4.

When N complex input data are input, the control circuit 5 closes input and opens the lines 1a and 1b to sequentially read out input data stored in the shift register 1 from x(0) and y(0), input real number data to the multiplier 6 and the multiplier 8, and input imaginary number data to the multiplier 7 and the multiplier 9. Where, delayed storage input data are preserved after N data have been read out, since data that are input multipliers are sequentially returned to the shift register 1 through the lines 1a and 1b.

In addition, the control circuit 5 starts the reversible counter 3 to monitor counted numbers when input of data to the multipliers start. If the filter degree N is an odd number (the case shown in FIG. 1) and the counted number of the reversible counter 3 becomes (N−1)/2, it instructs the switching circuit 41 to switch. Also, if the filter degree N is an even number, it instructs the switching circuit 41 to switch when the counted number of the reversible counter 3 becomes N/2−1.

Furthermore, when N times sum of products operation completes, the control circuit 5 closes the lines 1a and 1b to open input to the shift register 1 and resets the counted number of the reversible counter 3 and the sign control circuit 4.

6 is a first multiplier for multiplying a real number data from the shift register 1 and a real number coefficient from the coefficient storing circuit 2 controlled by the control circuit 5.

7 is a second multiplier for multiplying an imaginary number data from the shift register 1 and a real number coefficient from the coefficient storing circuit 2 controlled by the control circuit 5.

8 is a third multiplier for multiplying a real number data from the shift register 1 and an imaginary number coefficient sign-controlled by the sign reversing circuit 42.

9 is a fourth multiplier for multiplying an imaginary number data from the shift register 1 and an imaginary number coefficient sign-controlled by the sign reversing circuit 42.

100 is a first accumulator for accumulating multiplication results of the multiplier 6 and multiplication results of the multiplier 9. Where, the accumulator 100 consists of an adder 101 and a register 102.

200 is a second accumulator for accumulating multiplication results of the multiplier 7 and multiplication results of the multiplier 8. Where, the accumulator 200 consists of an adder 201 and a register 202.

Next, an operation of the FIR digital filter configured as above.

Here, only the case shown in FIG. 1 that the filter degree N is an odd number is explained, however, it is possible to understand that this FIR digital filter operates similarly even if the filter degree N is an even number, if the case that the filter degree N is an odd number is understood.

First, When N binary complex data, where each binary complex data consists of a pair of a real number data and an imaginary number data, are input to the shift register 1, the control circuit 5 closes input and opens the lines 1a and 1b. Then, it sequentially reads out input data stored in the shift register 1 from x(0) and y(0), inputs real number data to the multipliers 6 and 8, and outputs imaginary number data to the the multipliers 7 and 9.

Simultaneously to this, the control circuit 5 starts the reversible counter 3 and monitors the counting operation thereof.

The reversible counter 3 sequentially reads out binary complex filter coefficients from a(0) and b(0), outputs real number coefficients to the multipliers 6 and 7, and outputs imaginary number coefficients to the sign control circuit 4. At this time, the switch of the switching circuit 41 is set on the side of the multipliers 8 and 9 (the side of 1c), so that the sign of imaginary number coefficients are output to the multipliers 8 and 9, as they are.

In the multiplier 6, multiplication of real number data and real number coefficients is operated and the results are input to the accumulator 100.

In the multiplier 7, multiplication of imaginary number data and real number coefficients is operated and the results are input to the accumulator 200.

In the multiplier 8, multiplication of real number data and imaginary number coefficients is operated and the results are input to the accumulator 200.

In the multiplier 9, multiplication of imaginary number data and imaginary number coefficients is operated and the results are input to the accumulator 100.

In the accumulator 100, outputs of the multipliers 6 and 9 are accumulated by the adder 101 and the register 102, and the results become real number output of the filter.

In the accumulator 200, outputs of the multipliers 7 and 8 are accumulated by the adder 201 and the register 202, and the results become imaginary number output of the filter.

During these operations, the control circuit 5 is monitoring the counted number of the reversible counter 3. When the counted number becomes (N−1)/2, the control circuit 5 instructs the switching circuit 41 to turn the switch to the sign reversing circuit 42.

On the other hand, contrary to the above case, when the counted number becomes (N−1)/2, the reversible counter 3 sequentially reads out from a((N−3)/2)) to a(0) for real number coefficient, and from b((N−3)/2)) to b(0) for imaginary number coefficient. Then, real number coefficients are input to the multipliers 6 and 7, and imaginary number coefficients are input to the sign control circuit 4.

By this operation, the imaginary number coefficients input to the sign control circuit 4 are sign-reversed in the sign reversing circuit, output to the multipliers 8 and 9.

In the multiplier 6, multiplication of real number data and real number coefficients are operated, the results are input to the accumulator 100.

In the multiplier 7, multiplication of imaginary number data and real number coefficients are operated, the results are input to the accumulator 200.

In the multiplier 8, multiplication of real number data and imaginary number coefficients sign-reversed are operated, the results are input to the accumulator 200.

In the multiplier 9, multiplication of imaginary number data and imaginary number coefficients sign-reversed are operated, the results are input to the accumulator 100.

Then, same as above, real number output and imaginary number output of the filter are output from the accumulators 100 and 200.

Like this, when N times sum of products operations complete, the control circuit 5 closes the lines 1a and 1b to open input, ingests next new binary complex input data and resets the counted number of the reversible counter 3 and the sign control circuit 4.

By the above operations, filter output in a pass band can be obtained.

Next, the second embodiment is explained.

Figure 6:
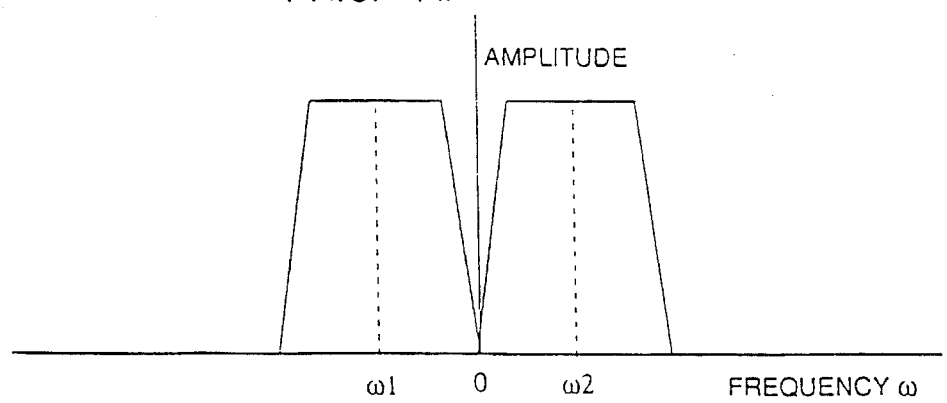
FIG. 6 is a figure showing a signal consisting of carriers of two waves symmetrically placed on 0Hz frequency axis.

The second embodiment is a case of processing a signal consisted of a multi-carrier of two waves ($\omega 1$ and $\omega 2$) located on 0Hz frequency axis in symmetry as shown in FIG. 6.

Figure 2:
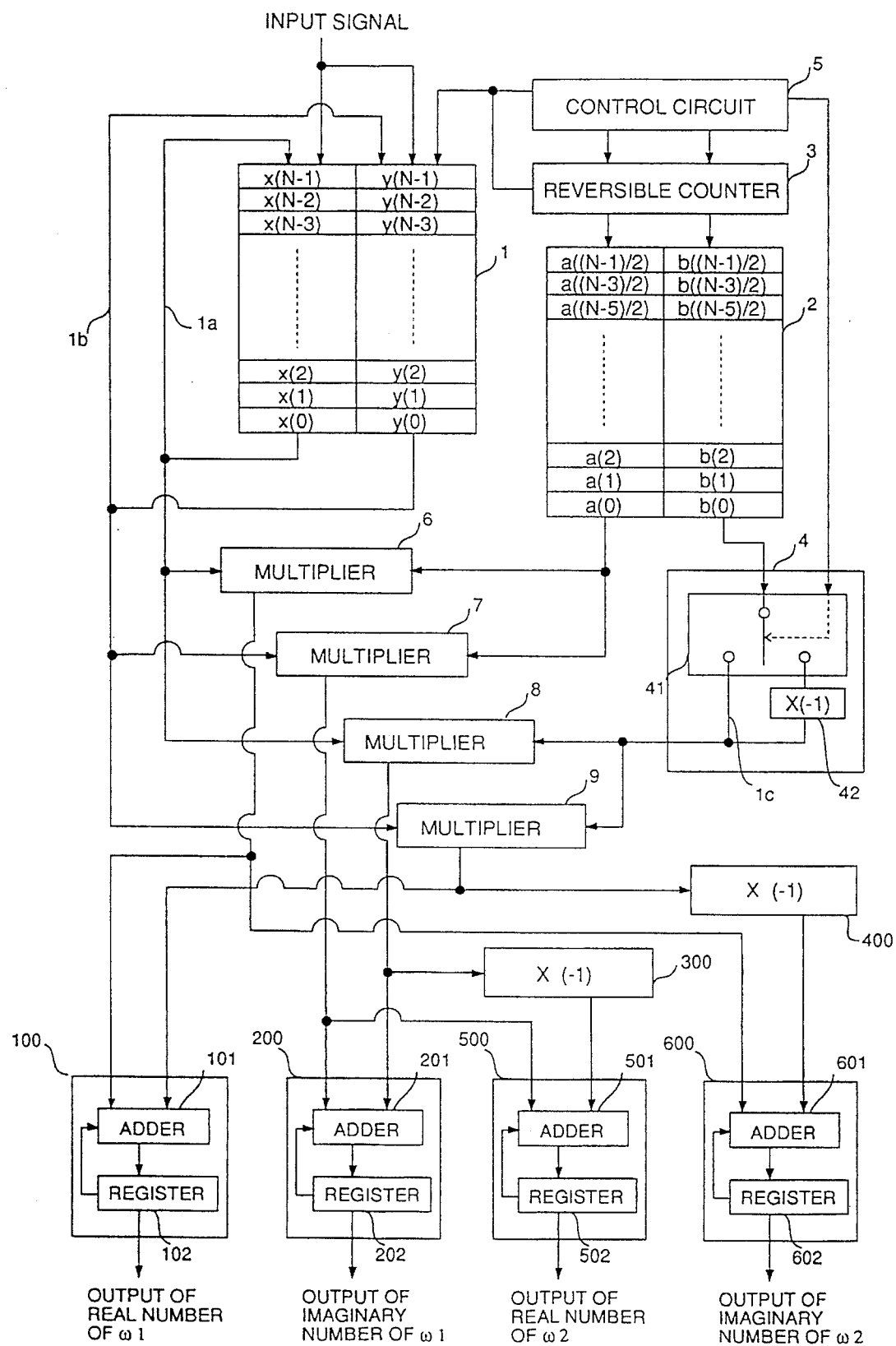
FIG. 2 is a figure showing a circuit configuration of the second embodiment of the present invention.
Figure 3:
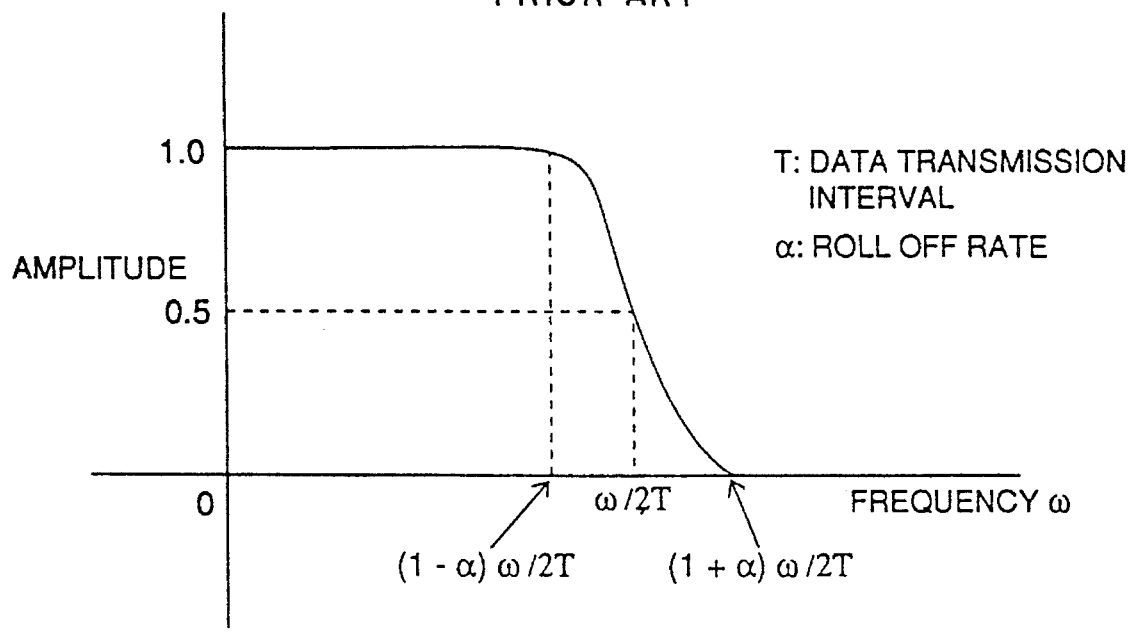
FIG. 3 is a figure of waveform showing frequency-to-amplitude characteristics of a roll off filter.
Figure 4:
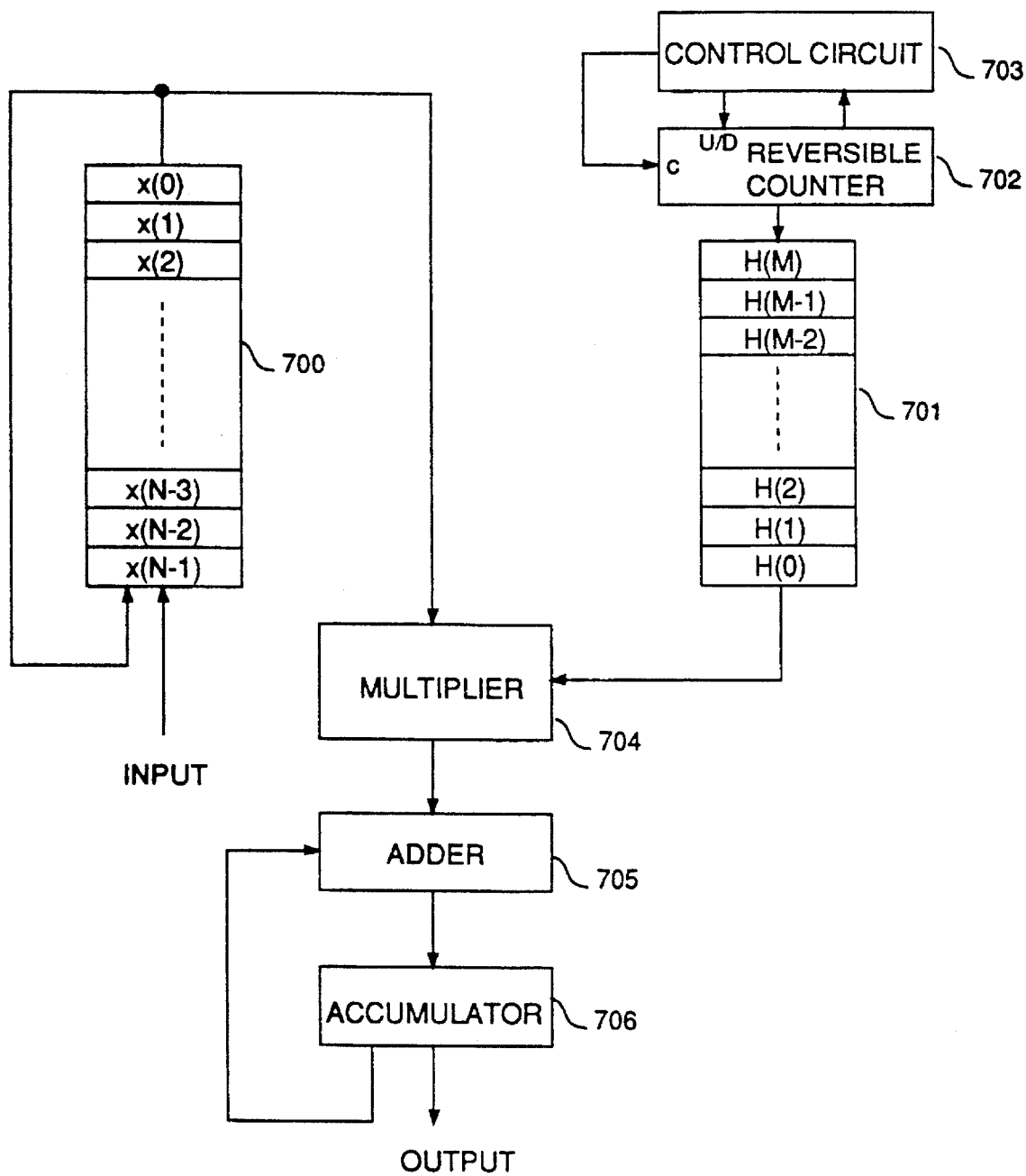
FIG. 4 is a figure showing a circuit configuration of a prior art.
Figure 5:
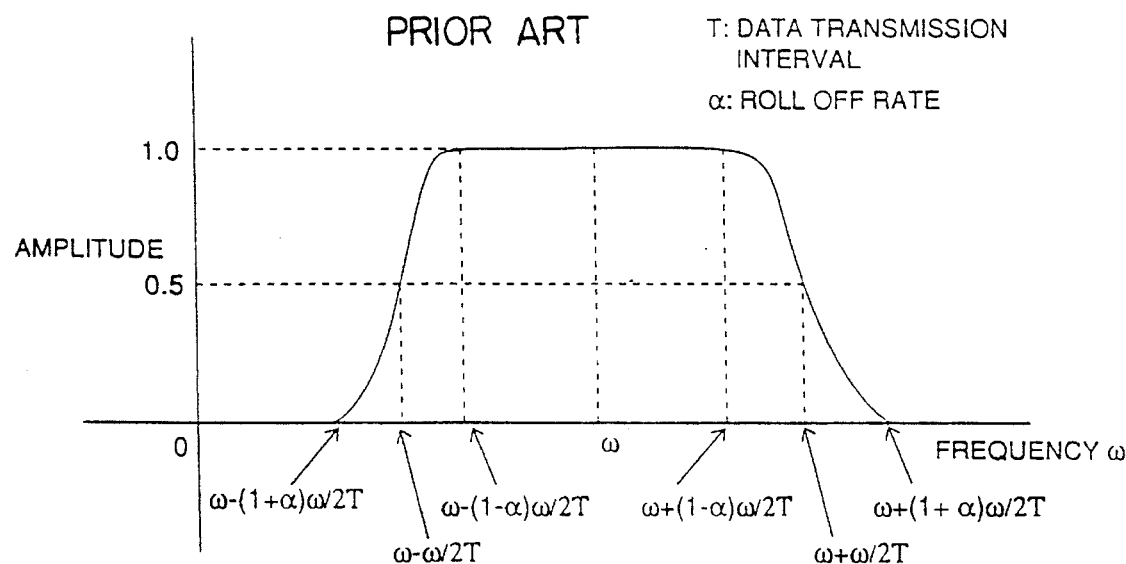
FIG. 5 is a figure of waveform showing frequency-to-amplitude characteristics of a roll off filter at pass band.

FIG. 2 shows a circuitry configuration of the second embodiment. Where, the same components as that of the first embodiment is reoffered to the same number in the first embodiment, and explanation for the configuration thereof is omitted.

300 is the second sign reversing circuit for reversing sign of output of the multiplier 8.

400 is the third sign reversing circuit for reversing sign of output of the multiplier 9.

500 is the third accumulator for accumulating outputs of the multiplier 7 and outputs of the sign reversing circuit 300. Where, the accumulator 500 consists of an adder 501 and an register 502.

600 is the fourth accumulator for accumulating outputs of the multiplier 6 and outputs of the sign reversing circuit 400. Where, the accumulator 600 consists of an adder 601 and an register 602.

Next, operations of the second embodiment configured as above is explained.

First, real number data and imaginary number data of the input binary complex input data as shown in FIG. 6 are delay-stored in the shift register 1.

Then, the shift register 1, the coefficient storing circuit 2, the reversible counter 3, the sign control circuit 4 and the control circuit 5 operate as described above, binary complex input data and binary complex filter coefficients are read out.

In the multiplier 6, multiplication of real number data and real number coefficients is operated and the results are output to the accumulators 100 and 600.

In the multiplier 7, multiplication of imaginary number data and real number coefficients is operated and the results are output to the accumulators 200 and 500.

In the multiplier 8, multiplication of real number data and imaginary number coefficients is operated and the results are output to the accumulator 200 and the sign reversing circuit 300.

In the multiplier 9, multiplication of imaginary number data and imaginary number coefficients is operated and the results are output to the accumulator 100 and the sign reversing circuit 400.

In the sign reversing circuit 300, the sign of the output of the multiplier 8 is reversed and the result is output to the accumulator 500.

In the sign reversing circuit 400, the sign of the output of the multiplier 9 is reversed and the result is output to the accumulator 600.

In the accumulator 100, outputs of the multipliers 6 and 9 are accumulated by the adder 101 and the register 102, and the result becomes a real number output of the filter against the frequency $\omega 1$.

In the accumulator 200, outputs of the multipliers 7 and 8 are accumulated by the adder 201 and the register 202, and the result becomes an imaginary number output of the filter against the frequency $\omega 1$.

In the accumulator 500, outputs of the multiplier 7 and the sign reversing circuit 300 are accumulated by the adder 501 and the register 502, and the result becomes a real number output of the filter against the frequency $\omega 2$.

In the accumulator 600, outputs of the multiplier 6 and the sign reversing circuit 400 are accumulated by the adder 601 and the register 602, and the result becomes an imaginary number output of the filter against the frequency $\omega 2$.

Like this, it is possible to conduct filtering of a signal consisted of a multi-carrier of two wave located in symmetry to 0Hz frequency axis.

It is to be noted that if the input signal consists of a multi-carrier of n waves located in symmetry to 0Hz frequency axis, it is possible to conduct roll off filtering for n waves simultaneously by providing the shift register 1, the coefficient storing circuit 2, the sign control circuit 4, the multipliers 6, 7, 8, 9, the sign reversing circuits 300 and 400 and accumulators 100, 200, 500 and 600, respectively n/2 units, and configuring them same as above and controlling them using the reversible counter 3 and the control circuit 5.

What is claimed is:

1. A Finite Impulse Response (FIR) digital filter of which an impulse response S(t) meets an equation, S(t)= H(t)exp(j$\omega$t), where H(t) represents roll off characteristics and $\omega$ is an arbitrary frequency, said FIR digital filter comprising:

a data storing means for delay-storing real number data and imaginary number data of a plurality of binary complex input data;

a coefficient storing means for storing real number coefficients and imaginary number coefficients of said FIR digital filter corresponding to s(0), s(1), ..., s((N-1)/2) when N is an odd number, and storing real number coefficients and imaginary number coefficients of said FIR digital filter corresponding to s(0), s(1), ..., s(N/2-1) when N is an even number, where s(0) to s(N-1) represent an impulse response string;

a reversible counting and reading out means for reading said real number coefficients and imaginary number coefficients stored in said coefficient storing means in order of s(0), s(1), ..., s((N-1)/2) at first order and s((N-3)/2)), ..., s(1), s(0) next at second order when N is the odd number, or reading said real number coefficients and imaginary number coefficients stored in said coefficient storing means in order of s(0), s(1), ..., s(N/2-1) at first order and s(N/2-1), ..., s(1), s(0) next at second order when N is the even number;

a sign control means for reversing a sign of the imaginary number coefficients which were read out at said second order from said coefficient storing means;

calculating means for calculating sums of products of said real number data and said imaginary number data output from said data storing means and real number coefficients and imaginary number coefficients output from said coefficient storing means and said sign control means; and control means for controlling said data storing means, said reversible counting and reading out means and said sign control means.

2. The FIR digital filter of claim 1, wherein said control means controls inputting of said binary complex input data to said data storing means and the reading out operation of said reversible counting and reading out means, and simultaneously controls said sign control means based on a counted number of said reversible counting and reading out means.

3. The FIR digital filter of claim 1, wherein said sign control means comprises:
   a sign reversing means for reversing the sign of said imaginary number coefficients input; and
   an input means for inputting said imaginary number coefficients output from said reversible counting and reading out means into said sign reversing means when reading out at said second order by said reversible counting and reading out means starts.

4. The FIR digital filter of claim 1, wherein said calculating means comprises:
   a first multiplier for multiplying a real number data output from said data storing means and a real coefficient read out from said coefficient storing means;
   a second multiplier for multiplying an imaginary number data output from said data storing means and a real coefficient read out from said coefficient storing means;
   a third multiplier for multiplying a real number data output from said data storing means and an imaginary coefficient output from said sign control means;
   a fourth multiplier for multiplying an imaginary number data output from said data storing means and an imaginary coefficient output from said sign control means;
   a first accumulating means for accumulating output of said first multiplier and output of said fourth multiplier; and
   a second accumulating means for accumulating output of said second multiplier and output of said third multiplier.

5. The FIR digital filter of claim 4, wherein
said first accumulator comprises:
   a first register for inputting an operation result, storing said operation result, and then outputting said operation result as a first operation result; and
   a first adder for adding said first operation result, output of said first multiplier and output of said fourth multiplier, then outputting the operation result to said first register; and
said second accumulator comprises:
   a second register for inputting an operation result, storing said operation result, and then outputting said operation result as a second operation result; and
   a second adder for adding said second operation result, output of said second multiplier and output of said third multiplier, then outputting the operation result to said second register.

6. The FIR digital filter of claim 4, wherein said calculating means further comprises:
   a second sign reversing means for reversing sign of output of said fourth multiplier;
   a third accumulating means for accumulating output of said second sign reversing means and output of said first multiplier;
   a third sign reversing means for reversing sign of output of said third multiplier; and
   a fourth accumulating means for accumulating output of said third sign reversing means and output of said second multiplier.

7. The FIR digital filter of claim 6, wherein
said third accumulator comprises:
   a third register for inputting an operation result, storing said operation result, and then outputting said operation result as a third operation result; and
   a third adder for adding said third operation result, output of said first multiplier and output of said second sign reversing means, then outputting the operation result to said third register; and
said fourth accumulator comprises:
   a fourth register for inputting an operation result, storing said operation result, and then outputting said operation result as a fourth operation result; and
   a fourth adder for adding said fourth operation result, output of said second multiplier and output of said third sign reversing means, then outputting the operation result to said fourth register.

8. A Finite Impulse Response (FIR) digital filter of which impulse response $S(t)$ meets an equation, $S(t)=H(t)\exp(j\omega t)$, where $H(t)$ represents roll off characteristics and $\omega$ is an arbitrary frequency, said FIR digital filter comprising:
   a data storing means for delay-storing real number data and imaginary number data of a plurality of binary complex input data;
   a coefficient storing means for storing real number coefficients and imaginary number coefficients of said FIR digital filter corresponding to $s(0), s(1), \ldots, s((N-1)/2)$ when N is an odd number, and storing real number coefficients and imaginary number coefficients of said FIR digital filter corresponding to $s(0), s(1), \ldots, s(N/2-1)$ when N is an even number, where $s(0)$ to $s(N-1)$ represent an impulse response string;
   a reversible counting and reading out means for reading said real number coefficients and imaginary number coefficients stored in said coefficient storing means in order of $s(0), s(1), \ldots, s((N-1)/2)$ at first order and $s((N-3)/2)), \ldots, s(1), s(0)$ next at second order when N is the odd number, or reading said real number coefficients and imaginary number coefficients stored in said coefficient storing means in order of $s(0), s(1), \ldots, s(N/2-1)$ at first order and $s(N/2-1), \ldots, s(1), s(0)$ next at second order when N is the even number;
   a sign control means for reversing a sign of the imaginary number coefficients which were read out at said second order by said reversible counting and reading out means;
   a control means for controlling said data storing means, said reversible counting and reading out means and said sign control means;
   a first multiplier for multiplying a real number data output from said data storing means and a real coefficient read out from said coefficient storing means;
   a second multiplier for multiplying an imaginary number data output from said data storing means and a real coefficient read out from said coefficient storing means;
   a third multiplier for multiplying a real number data output from said data storing means and an imaginary coefficient output from said sign control means;
   a fourth multiplier for multiplying an imaginary number data output from said data storing means and an imaginary coefficient output from said sign control means;
   a first accumulating means for accumulating output of said first multiplier and output of said fourth multiplier; and
   a second accumulating means for accumulating output of said second multiplier and output of said third multiplier.

9. A Finite Impulse Response (FIR) digital filter of which impulse response S(t) meets an equation, S(t)=H(t)exp(jωt), where H(t) represents roll off characteristics and ω is an arbitrary frequency, comprising:

- a data storing means for delay-storing real number data and imaginary number data of a plurality of binary complex input data;
- a coefficient storing means for storing real number coefficients and imaginary number coefficients of said FIR digital filter corresponding to s(0), s(1), ..., s((N−1)/2) when N is an odd number, and storing real number coefficients and imaginary number coefficients of said FIR digital filter corresponding to s(0), s(1), ..., s(N/2−1) when N is an even number, where s(0) to s(N−1) represent an impulse response string;
- a reversible counting and reading out means for reading said real number coefficients and imaginary number coefficients stored in said coefficient storing means in order of s(0), s(1), ..., s((N−1)/2) at first order and s((N−3)/2)), ..., s(1), s(0) next at second order when N is the odd number, or reading said real number coefficients and imaginary number coefficients stored in said coefficient storing means in order of s(0), s(1), s(N/2−1) at first order and s(N/2−1), ..., s(1), s(0) next at second order when N is the even number;
- a sign control means for reversing a sign of the imaginary number coefficients which were read out at said second order by said reversible counting and reading out means;
- a control means for controlling said data storing means, said reversible counting and reading out means and said sign control means;
- a first multiplier for multiplying a real number data output from said data storing means and a real coefficient read out from said coefficient storing means;
- a second multiplier for multiplying an imaginary number data output from said data storing means and a real coefficient read out from said coefficient storing means;
- a third multiplier for multiplying a real number data output from said data storing means and an imaginary coefficient output from said sign control means;
- a fourth multiplier for multiplying an imaginary number data output from said data storing means and an imaginary coefficient output from said sign control means;
- a first accumulating means for accumulating output of said first multiplier and output of said fourth multiplier;
- a second accumulating means for accumulating output of said second multiplier and output of said third multiplier;
- a second sign reversing means for reversing a sign of output of said fourth multiplier;
- a third accumulating means for accumulating output of said second sign reversing means and output of said first multiplier;
- a third sign reversing means for reversing a sign of output of said third multiplier; and
- a fourth accumulating means for accumulating output of said third sign reversing means and output of said second multiplier.

10. A signal processing method of a Finite Impulse Response (FIR) digital filter of which impulse response S(t) meets an equation, S(t)=H(t)exp(jωt) and the impulse response string is represented by s(0) to s(N−1), where H(t) represents roll off characteristics and ω is an arbitrary frequency, comprising:

- (a) a step of storing real number coefficients and imaginary number coefficients of said FIR digital filter corresponding to s(0), s(1), ..., s((N−1)/2) when N is an odd number, and storing real number coefficients and imaginary number coefficients of said FIR digital filter corresponding to s(0), s(1), ..., s(N/2−1) when N is an even number;
- (b) a step of sequentially reading out said real number coefficients stored and imaginary number coefficients stored in order of s(0), s(1), ..., s((N−1)/2) at first order and s((N3)/2), ..., s(1), s(0) next at second order when N is the odd number, or reading out said real number coefficients stored and imaginary number coefficients stored in order of s(0), s(1), ..., s(N/2−1) at first order and s(N/2−1), ..., s(1), s(0) next at second order when N is the even number;
- (c) a step of controlling sign of said imaginary number coefficient by not changing a sign of said imaginary number coefficient when said imaginary number coefficient have been read out at said first order, and by reversing the sign of said imaginary number coefficient when said imaginary number coefficient has been read out at said second order;
- (d) a step of generating real number data and imaginary number data of a plurality of binary complex input data; and
- (e) a step of calculating sums of products said real number data, said imaginary number data, said real number coefficient read out in said (b) and the sign-controlled imaginary number coefficients in step (c).

11. The signal processing method using the FIR digital filter of claim 10, wherein step (e) comprises:

- (f) a step of multiplying said real number data and said real number coefficients;
- (g) a step of multiplying said imaginary number data and said real number coefficients;
- (h) a step of multiplying said real number data and said sign-controlled imaginary number coefficients;
- (i) a step of multiplying said imaginary number data and said sign-controlled imaginary number coefficients;
- (j) a step of accumulating multiplication result in step (f) and multiplication result in step (i); and
- (k) a step of accumulating multiplication results in step (g) and multiplication result in step (h).

12. The signal processing method using the FIR digital filter of claim 11, wherein step (e) further comprises:

- (l) a step of reversing sign of multiplication result in step (i);
- (m) a step of accumulating multiplication result of the sign-reversed in step (l) and multiplication result in step (f);
- (n) a step of reversing sign of multiplication result in step (h); and
- (o) a step of accumulating multiplication result of the sign-reversed in step (n) and multiplication result in said (f) step (g).

* * * * *